United States Patent
Wang et al.

(10) Patent No.: US 9,865,479 B2
(45) Date of Patent: Jan. 9, 2018

(54) METHOD OF ATTACHING COMPONENTS TO PRINTED CIRUCUIT BOARD WITH REDUCED ACCUMULATED TOLERANCES

(71) Applicant: Avago Technologies General IP (Singapore) Pte. Ltd., Singapore (SG)

(72) Inventors: Wei-Shun Wang, Palo Alto, CA (US); Li Sun, Fremont, CA (US); Ashish Alawani, San Jose, CA (US); Lea-Teng Lee, Sunnyvale, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/130,202

(22) Filed: Apr. 15, 2016

(65) Prior Publication Data

US 2017/0301559 A1   Oct. 19, 2017

(51) Int. Cl.
| | |
|---|---|
| *H01L 21/44* | (2006.01) |
| *H01L 21/48* | (2006.01) |
| *H01L 21/50* | (2006.01) |
| *H01L 21/60* | (2006.01) |

(52) U.S. Cl.
CPC ...... *H01L 21/4853* (2013.01); *H01L 21/4864* (2013.01); *H01L 2021/6009* (2013.01); *H01L 2021/6024* (2013.01); *H01L 2021/60135* (2013.01)

(58) Field of Classification Search
CPC . H01L 21/4853; H01L 21/4867; H01L 21/32; H01L 21/4825; H01L 21/4835; H01L 21/4864

USPC .......... 438/612, 613, 108, 125; 257/E21.508
See application file for complete search history.

(56) References Cited

U.S. PATENT DOCUMENTS

| | | | |
|---|---|---|---|
| 5,825,629 A | 10/1998 | Hoebener et al. | |
| 6,494,361 B1 | 12/2002 | Scanlan et al. | |
| 6,979,636 B1 | 12/2005 | Lin et al. | |
| 2004/0000704 A1* | 1/2004 | Tsao ..................... | H05K 3/3436 257/684 |
| 2005/0189402 A1* | 9/2005 | Westmoreland ..... | B23K 3/0623 228/215 |

(Continued)

OTHER PUBLICATIONS

William E. Coleman et al., "Step Stencils: a powerful tool for special applications",SMT Magazine, Aug. 2011, pp. 34-43.

*Primary Examiner* — Thien F Tran

(57) ABSTRACT

A method is provided for attaching components to pads on a PCB, where total accumulated tolerances are reduced by separating accumulated tolerances into multiple processes. The method includes performing first and second processes having first and second accumulated tolerances, respectively. The first process includes placing a first stencil over the PCB, the first stencil defining first apertures corresponding to the pads; printing solder paste onto the pads using the first stencil; and reflowing the printed solder paste to form corresponding solder bumps on the pads. The second process includes placing a second stencil over the PCB, the second stencil defining second apertures corresponding to the pads; printing flux onto the solder bumps using the second stencil; placing at least one component on the printed flux; and reflowing the printed flux and the solder bumps to form corresponding solder joints between the at least one component and the first pads, respectively.

20 Claims, 5 Drawing Sheets

(56) References Cited

U.S. PATENT DOCUMENTS

2010/0147928 A1* 6/2010 Wettermann ......... B23K 3/0638
228/180.22

* cited by examiner

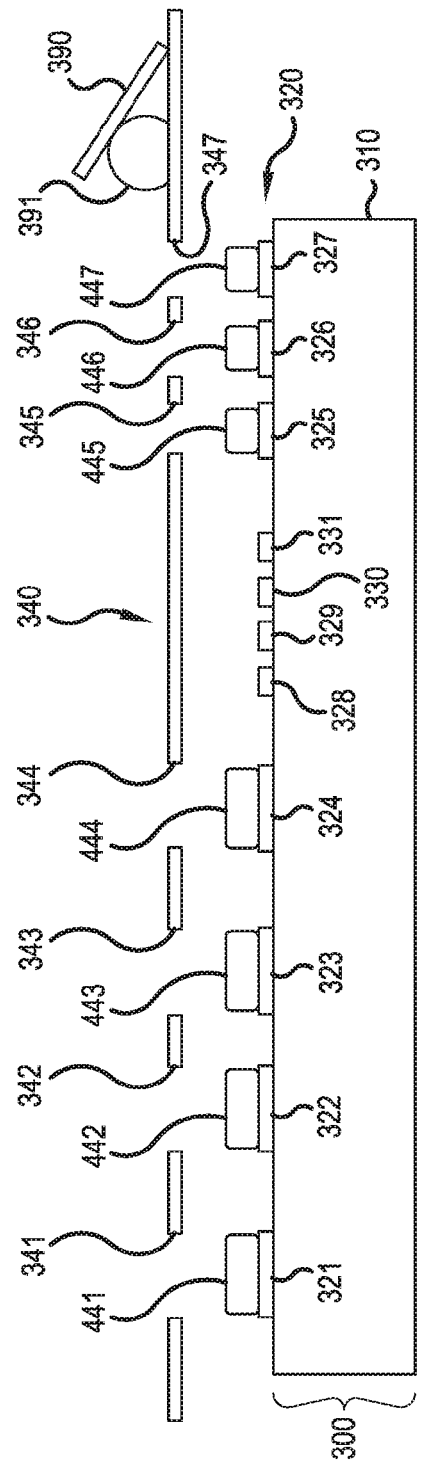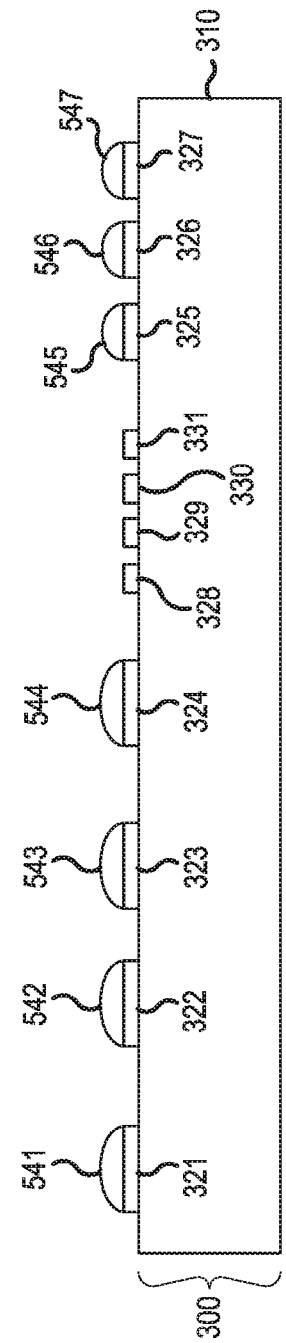
FIG.3A
FIG.3B

METHOD OF ATTACHING COMPONENTS TO PRINTED CIRUCUIT BOARD WITH REDUCED ACCUMULATED TOLERANCES

BACKGROUND

There is increasing demand for smaller electronic devices, particularly with respect to radio frequency (RF) wireless communication products, for example. These products typically include solid state modules (or packages) having various features, such as electronic circuitry and components attached to and/or embedded in a printed circuit board (PCB), molded compound applied to a surface of the PCB to protect the electrical circuitry and components, and conductive (e.g., metal) pads formed on an opposite surface of the PCB to accommodate subsequent mounting (e.g., using solder) of the modules within the electronic devices, possibly on another PCB.

Tighter placement of the components on a PCB is desirable in order to decrease the size of the module, and thus the electronic device containing the module. For example, surface mount technology (SMT) components are commonly attached to pads on a surface of the PCB. As circuit designs further reduce spaces between SMT components in RF system-in-package (SIP) modules, for example, the accumulated tolerance of tooling, equipment accuracy and raw materials in a conventional fabrication method is too close to the spaces between the SMT components, making it nearly impossible to further reduce the spaces between components. Also, solder paste used to attach the SMT components (as well as other types of components) to the PCB may electrically short after a pick and place process due to the high accumulated tolerance, and solder paste squeezing out from beneath the SMT components may lead to solder electrical shorts after reflow. Currently, attempted solutions include tightening the pick and place accuracy tolerance and force control. However, such solutions are limited by equipment capability, and thus the resulting reduction in accumulated tolerance is minimal.

Accordingly, there is a need to reduce accumulated tolerance, e.g., using existing equipment capability, to enable tighter placement of various components on PCBs.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements throughout the drawings and written description.

FIGS. 3A to 3E are simplified cross-sectional view of a PCB showing a method of attaching components to pads on the PCB, split into multiple processes, according to a representative embodiment.

DETAILED DESCRIPTION

Figure 1:
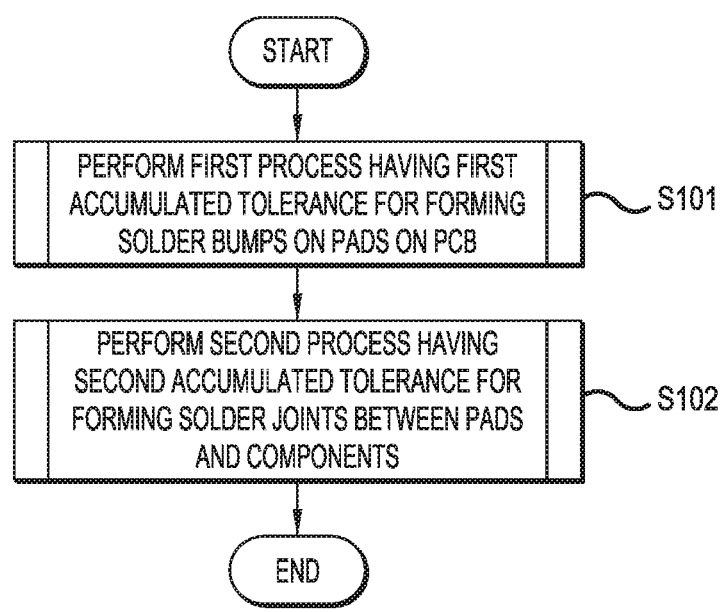
FIG. 1 is a flow diagram showing a method of attaching components to pads on a printed circuit board (PCB), split into multiple processes, according to a representative embodiment.

In the following detailed description, for purposes of explanation and not limitation, example embodiments disclosing specific details are set forth in order to provide a thorough understanding of the present teachings. However, it will be apparent to one of ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree to one of ordinary skill in the art. The term "approximately" means to within an acceptable limit or amount to one of ordinary skill in the art. Relative terms, such as "above," "below," "top," "bottom," "upper" and "lower" may be used to describe the various elements" relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device or component is said to be connected or coupled to a second device or component, this encompasses examples where one or more intermediate devices or components may be employed to connect the two devices or components to each other. In contrast, where a first device or component is said to be directly connected or directly coupled to a second device or component, this encompasses examples where the two devices or components are connected together without any intervening devices or components other than electrical connectors (e.g., wires, bonding materials, etc.).

In various representative embodiments, application of components, such as SMT and/or flip chip components, to a PCB during fabrication of a solid state module is split into two processes, each having a corresponding accumulated tolerance. Accumulated tolerance is an implied total process tolerance which represents the impact of all individual process variations. Accumulated tolerances may be calculated as arithmetic sum tolerances which provide worst-case maximum or minimum values, or may be calculated as statistical tolerances using root sum square, root mean square or other statistical method. By splitting the attachment of the components into two processes, the accumulated tolerance in each process is significantly smaller than accumulated tolerance corresponding to a single, continuous attachment process, and can be handled within existing equipment capability without sacrificing quality and assembly yield. Likewise, the combined accumulated tolerances of the two processes is likewise smaller than the total accumulated tolerance corresponding to the single, continuous attachment process.

Figure 2A:
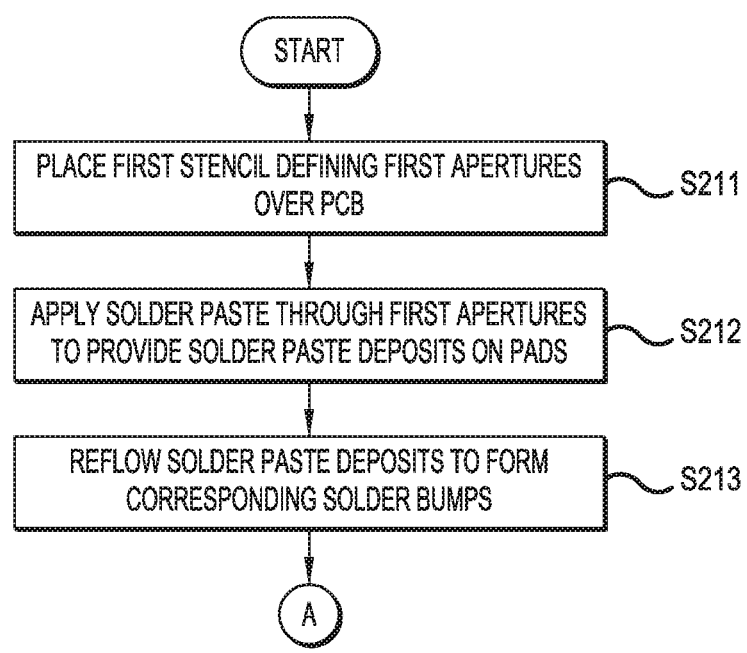
FIG. 2A is a flow diagram showing a first process of the multiple processes in the method of FIG. 1A, according to a representative embodiment.
Figure 2B:
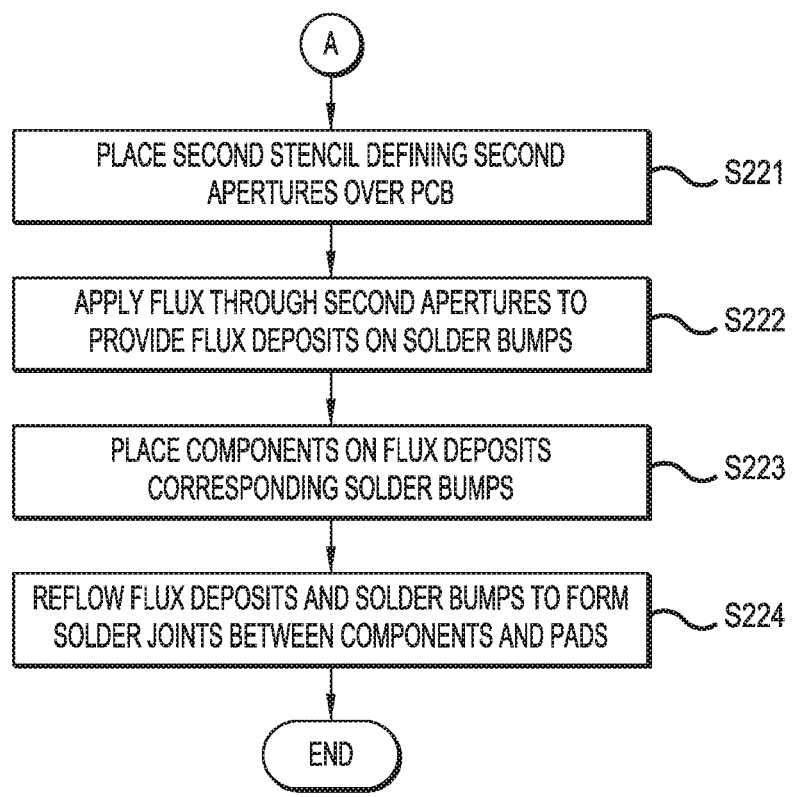
FIG. 2B is a flow diagram showing the second process of the multiple processes in the method of FIG. 1A, according to a representative embodiment.

FIG. 1 is a flow diagram showing a method of attaching components to pads on a printed circuit board (PCB), split into two processes, according to a representative embodiment. For purposes of discussion, the two processes are referred to herein as first and second processes, which when combined, provide the full method of attaching the components to the pads on the PCB. FIG. 2A is a flow diagram showing the first process of the method indicated in FIG. 1A, FIG. 2B is a flow diagram showing the second process of the method indicated in FIG. 1A, according to a representative embodiment.

Referring to FIG. 1, a first process is performed in block S101 for forming solder bumps on the pads on the PCB. The first process has a corresponding first accumulated tolerance. A second process is performed in block S102 for forming solder joints between the pads on the PCB and the components attached to the pads. The second process has a corresponding second accumulated tolerance. The total or combined accumulated tolerance of the method of attaching components to pads on the PCB is determined by simply adding the first accumulated tolerance and the second accumulated tolerance. In other words, the individual tolerance of the steps in the second process in block S102 do not individually build on the first accumulated tolerance, which further reduces total accumulated tolerance.

Referring to FIG. 2A, which shows the first process, a first stencil is placed over the PCB in block S211. The first stencil defines multiple first apertures that correspond to first pads of the multiple pads on the PCB. Depending on the configuration of the pads and the types of components to be mounted to these pads (e.g., SMT components, flip chip components, or the like), the first apertures may correspond to all of the pads on the PCB, or to some subset of all of the pads on the PCB, as discussed further below.

In block S212, solder paste is applied through the first apertures in the first stencil to provide corresponding solder paste deposits on the first pads, after which the first stencil is removed. This operation may be referred to as solder paste printing. The solder paste comprises a mixture of solder and flux in predetermined proportions. In an embodiment, a solder paste inspection (SPI) may be performed after removal of the first stencil. The SPI may include applying light to the solder paste deposits and analyzing the reflection of the light to identify defects, to check for alignment of the solder paste deposits on the first pads, and the like.

The solder paste deposits are then reflowed in block S213 to form corresponding solder bumps on the first pads, respectively. Reflowing the solder paste deposits may include temporarily applying heat to the structure, including the PCB, the pads and the solder paste deposits, for example, causing the solder paste deposits to melt. For example, the structure may be heated by placing it in a heated environment, such as a reflow oven. The heated environment may contain an excess of nitrogen to enable better wetting characteristics of the solder bumps, and to prevent oxidation of solder bumps at high temperatures. When the solder paste deposits are in the melted or molten state, they become substantially rounded (effectively forming a half circle or half ellipse). The solder paste deposits are then allowed to cool and solidify into the solder bumps, having substantially rounded top surfaces, attached to (e.g., adhered to or bonded with) the first pads, respectively.

In an embodiment, flux cleaning may be performed after reflowing the solder paste deposits in order to remove excess or residual flux of the solder paste from the PCB. The flux cleaning may be a wet process, for example, although various flux cleaning processes may be incorporated without departing from the scope of the present teachings. Also, in an embodiment, a coining or other mechanical process may be performed on the solder bumps, after they have substantially cooled and hardened, to provide flattened surfaces of the solder bumps. The flattened surfaces of the solder bumps may be substantially co-planar.

Notably, unlike conventional methods, the reflowing of the solder paste is performed before component(s) are placed on the pads, which prevents the solder paste from being compressed and squeezing out from under the component(s) due to the weight of the component(s)) while the solder paste is in substantially liquid form during reflow. This reduces and/or eliminates solder paste electrical shorts between adjacent pads. The formation of the solder bumps ends the first process.

Referring to 2B, which shows the second process, a second stencil is placed over the PCB in block S221. The second stencil defines multiple second apertures that correspond to second pads of the multiple pads on the PCB. In an embodiment, the second pads are the same pads as the first pads, meaning that the second apertures in the second stencil are substantially the same (e.g., in size, shape and location) as the first apertures in the first stencil. In an alternative embodiment, the second apertures may differ from the first apertures (e.g., in that there are more second apertures than first apertures), and thus correspond to second pads that include additional pads on the PCB that do not correspond to any of the first apertures in the first stencil. Because these additional (second) pads do not correspond to any of the first apertures in the first stencil, they do not have solder bumps attached to them as a result of the preceding first process. The alternative embodiment is discussed further, below.

In block S222, flux is applied through the second apertures in the second stencil to provide corresponding flux paste deposits on the solder bumps on the first pads, after which the second stencil is removed. This operation may be referred to as flux printing. In an alternative embodiment, to the extent one or more of the second apertures in the second stencil do not align with solder bumps previously formed on the first pads, the flux applied through the second apertures provides corresponding flux deposits on additional second pads (i.e., pads that did not have corresponding apertures in the first stencil, and thus did not have corresponding solder bumps formed thereon).

At least one component is placed on the flux deposits in block S223, which may involve a pick and place procedure. For example, SMT components and/or flip chip components may be placed on the flux deposits using automated pick and place equipment, such as chip shooters, for example, as would be apparent to one of ordinary skill in the art. Such pick and place equipment may have multiple robotic heads for placing components simultaneously at various locations, thereby improving throughput. The flux deposits and the solder bumps are reflowed in block 224 to form corresponding solder joints between the at least one component and the multiple pads (i.e., the first and/or second pads), respectively. Reflowing the flux deposits and the solder bumps may include temporarily applying heat to the structure, including the PCB, the pads, the solder bumps, the flux deposits and the at least one component, for example, causing the solder paste deposits to melt, as discussed above. The heat is then removed so that the combined flux and solder solidifies into the solder joints, attaching the at least one component to the multiple pads. Significantly the tacky textures of the flux deposits hold the at least one component substantially in place during the second reflow process, so that the at least one component effectively does not change position and/or orientation, as a practical matter. The formation of the solder joints ends the second process of the method of attaching components to pads on the PCB. In an embodiment, flux cleaning may be performed after reflowing the flux deposits and the solder bumps in order to remove excess or residual flux from the PCB.

As mentioned above, in an alternative embodiment, the second apertures in the stencil are not necessarily the same as the first apertures in the first stencil, depending on the configuration of the pads and the types of components to be mounted to the pads. For example, the second apertures defined in the second stencil may include a first group of second apertures that correspond to the first pads (like the first apertures defined in the first stencil), and a second group of second apertures that correspond to second pads of the multiple pads on the PBC, where the second pads have no corresponding first apertures. In other words, in the alternative embodiment, the second stencil includes second apertures that correspond to all of the first apertures (i.e., the first group of second apertures) to enable flux to be applied to the solder bumps formed by the first process, and may further include second apertures that do not correspond to any of the first apertures (i.e., the second group of second apertures), such that flux is also applied directly to pads (i.e., second pads) on which solder bumps have not been formed. The alternative embodiment thus accommodates different types of components.

For example, SMT components are placed on pads having both solder and flux deposits in order to attach (electrically and/or mechanically) to the PCB. Meanwhile, flip chip components, which already include previously formed solder bumps on their respective surfaces, are placed on pads having only flux deposits in order to attach (electrically and/or mechanically) to the PCB. The previously formed solder bumps of flip chip components are configured to align with the pads. Thus, requirements of the second apertures to include only the first group of second apertures, or both the first and second groups of second apertures, may vary to provide unique benefits for any particular situation or to meet application specific design requirements of various implementations, as would be apparent to one of ordinary skill in the art. Notably, to the extent that only flip chip components are to be attached to the PCB, only one stencil is required, the one stencil being used for application of flux deposits on the PCB pads.

As mentioned above, the accumulated tolerances of each of the first and second processes, as well as the combined accumulated tolerances of the first and second processes, are smaller than the accumulated tolerance corresponding to a conventional single, continuous attachment process.

Tolerances associated with the first process include aperture tolerance, aperture position, print alignment, PCB block shift and PCB fiducial-to-fiducial (FF) distance. Aperture tolerance indicates the accuracy of the sizes and shapes of the apertures, respectively, in the first (and second) stencils as compared to design requirements. Aperture position indicates the accuracy of the positions of the apertures in the first stencil. Print alignment indicates the accuracy of the solder paste printing onto the PCB with respect to alignment of the aperture with the pads onto which the solder paste is printed. PCB block shift indicates movement of the PCB during the printing process. PCB FF distance indicates alignment of opposite corners of the PCB to locate and align the stencil to the PCB.

Tolerances associated with the second process include first and second placement accuracy, and first and second component tolerance. The first placement accuracy indicates the level of accuracy with which a first type of component (e.g., SMT component) is placed on the corresponding flux deposits, and the second placement accuracy indicates the level of accuracy with which a second type of component (e.g., flip chip component) is placed on the corresponding flux deposits. The first component tolerance indicates size tolerance of the first type of component, and the component tolerance indicates size tolerance of the second type of component.

In comparison to FIGS. 1, 2A and 2B, the conventional method of attaching components to a PCB includes, in order, steps of flux printing on pads of the PCB using a first stencil, solder paste printing on the flux of at least a portion of the pads of the PCB using a second stencil, placing components on the printed solder paste and/or flux (depending on the type of component, as discussed above), and then reflowing the flux and solder paste deposits (i.e., after placement of the components) to form solder joints. Additional operations may include performing SPI after the solder paste printing, and flux cleaning after the reflowing of the flux and solder paste. As mentioned above, because the reflowing of the solder paste deposits occurs after placement of the components, the solder paste may electrically short due to the accumulated tolerances and/or the solder paste squeezing out from beneath the component while in a liquid state, leading to solder short defects after reflow. Accordingly, the conventional method required high accuracy with respect to solder paste printing and component placement. In addition, the low force component placement required, which is very difficult to control, to avoid pressing down on the components too hard onto the flux and solder paste before the reflowing operation.

The accumulated tolerances of such a conventional method are less desirable than the representative embodiments described above with reference to FIGS. 1, 2A and 2B. For example, there are at least two additional tolerances to take into account: first and second component solder spread. The first component solder spread indicates the extent to which solder paste spreads across the PCB from under the first type of components during reflow, and the second component solder spread indicates the extent to which solder paste spreads across the PCB from under the second type of components during reflow. In addition, the tolerances accumulate in series over the entire, continuous process. In comparison, according to the various embodiments of the present disclosure, tolerances accumulate over two processes, each of which has fewer steps than the conventional process discussed above, and thus lower accumulated tolerances. The accumulated tolerances of the two processes may be added for a total accumulated tolerance, which is also less than the accumulated tolerance of the conventional process.

Figure 3C:
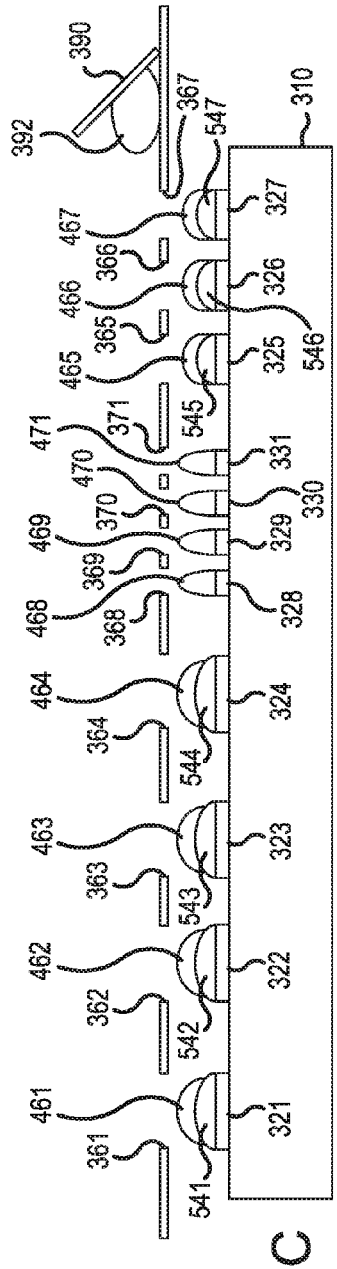
Figure 3D:
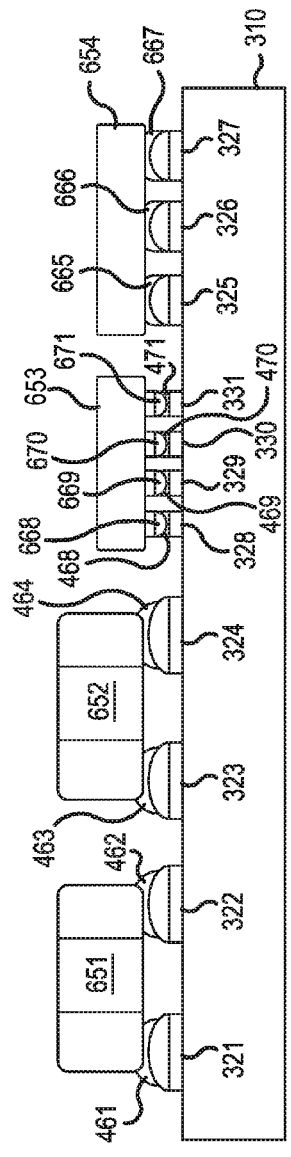
Figure 3E:
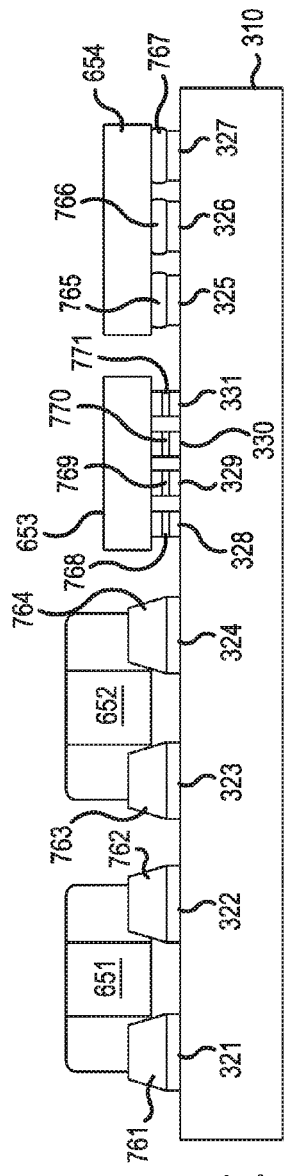

FIGS. 3A to 3E are simplified cross-sectional view of a PCB showing a method of attaching components to pads on the PCB, split into multiple processes, according to a representative embodiment. In the depicted embodiment, FIGS. 3A to 3B show steps of the first process and FIGS. 3C to 3E show steps of the second process of the method for attaching components to pads on the PCB.

Referring to FIG. 3A, a portion of a PCB 300 is shown, where the PCB 300 includes at least substrate 310 and patterned conductive layer 320 on a top surface of the substrate 310. The substrate may be formed of prepeg material, which generally includes a base material, such as glass fabric impregnated with resin, and may be compressed and laminated with layers of patterned metal or other conductors. The patterned conductive layer 320 may be formed of metal, and photo etched into a predetermined pattern of multiple pads using photolithography, for example. In the illustrative embodiment, the multiple pads being indicated by representative pads 321 to 331, which may be formed of various electrically and/or thermally conductive materials, such as copper (Cu), silver (Ag), gold (Au), or nickel (Ni), for example. The pads 321 to 331 are arranged so that various components, such as SMT and flip chip components (discussed below), may be electrically and/or mechanically attached to the substrate 310 (via the pads 321 to 331).

A first stencil 340 is placed over the substrate 310 and the pads 321 to 331, where the first stencil defines first apertures 341 to 347 corresponding to pads 321 to 327, respectively, which may be referred to as first pads 321 to 327 in the context of discussing corresponding first apertures 341 to 347. The first stencil 340 may be formed by machining or laser etching a sheet of metal, such as stainless steel, for example, before the first stencil 340 is placed over the substrate 310 and the pads 321 to 331. The first stencil 340 alternatively may be formed by photolithography or any other means for applying the predetermined pattern of first pads 321 to 327, for example. In various embodiments, the first stencil 340 may be reusable, thus providing cost savings. In the configuration depicted in FIG. 3A, the first stencil 340 does not include apertures over pads 328, 329, 330 and 331, which are designed to receive a flip chip component having previously formed solder bumps on its surface, as mentioned above.

Solder paste (e.g., from solder paste source 391) is applied through the first apertures 341 to 347 in the first stencil 340 to provide corresponding solder paste deposits 441 to 447, respectively. The solder paste may be a mixture of solder (e.g., an alloy of tin and lead or tin, silver and copper) and flux, and has a sticky consistency. Like the first apertures 341 to 347 in the first stencil 340, the solder paste deposits 441 to 447 correspond to the predetermined pattern of pads 321 to 329 of the representative PCB 300.

In an embodiment, the solder paste may be applied by spreading the solder paste from the solder paste source 391, initially provided at one end of the first stencil 340, over the top surface of the first stencil 340 using a squeegee 390. The squeegee 390 may be manipulated manually or may be automated. Downward pressure applied to the squeegee 390 (toward the top surface of the first stencil 340) while spreading the solder paste from the solder paste source 391 forces the solder paste into the first apertures 341 to 347. The pliability of the solder paste results in each of the first apertures 341 to 347 being substantially filled with the solder paste to form the solder paste deposits 441 to 447, respectively. The first stencil 340 is then removed, leaving the solder paste deposits 341 to 347 on the pads 321 to 327. As discussed above, an SPI may be performed after removal of the first stencil 340.

Referring to FIG. 3B, the solder paste deposits 441 to 447 are reflowed to form corresponding solder bumps 541 to 547 on the first pads 321 to 327, respectively. As discussed above, reflowing the solder paste deposits generally includes applying heat so that solder paste deposits 441 to 447 substantially melt, and then removing the heat so that the solder paste cools and solidifies into the solder bumps 541 to 547. The reflowing process results in the solder bumps 541 to 547 adhering to the first pads 321 to 327, respectively, and forming substantially rounded top surfaces due to the melting process, as shown in FIG. 3B. As discussed above, flux cleaning may be performed after reflowing the solder paste deposits 441 to 447 to form the solder bumps 541 to 547, removing excess or residual flux of the solder paste from the PCB 300. Also, in an embodiment, a coining or other mechanical process may be performed on the solder bumps 541 to 547, after they have substantially cooled and hardened, to provide flattened top surfaces (not shown) of the solder bumps 541 to 547.

Referring to FIG. 3C, a second stencil 360 is placed over the substrate 310 and the pads 321 to 331 (as well as the solder bumps 541 to 547), where the second stencil 360 defines second apertures 361 to 371 corresponding to pads 321 to 331, respectively. In the context of discussing corresponding second apertures 361 to 371, the pads 321 to 331 may be referred to as second pads 321 to 331 to distinguish over the pads 321 to 327 having corresponding first apertures of the first stencil 340. For example, the first stencil 340 does not include any first apertures corresponding to the pads 328 to 331, and thus the first pads include pads 321 to 327, but not pads 328 to 331. Meanwhile the second stencil 360 includes apertures corresponding to all of the depicted pads 328 to 331, and thus the second pads include pads 321 to 331.

Further, for purposes of discussion, the second apertures 361 to 371 in the second stencil 360 may be divided into first and second groups of second apertures. The first group of second apertures (i.e., second apertures 361 to 367) correspond to the pads 321 to 327, and thus also correspond to the first apertures 341 to 347 in the first stencil 340. The second group of second apertures (i.e., second apertures 368 to 371) correspond to the pads 328 to 331, and thus have no corresponding first apertures in the first stencil 340. Therefore, in the representative embodiment depicted in FIGS. 3A to 3E, the pads 321 to 327 are first pads corresponding to the first apertures 341 to 347, the pads 321 to 327 are also second pads corresponding to the first group of second apertures 361 to 367, and the pads 328 to 331 are second pads corresponding to the second group of second apertures 368 to 371. If the second apertures of the second stencil 360 were the same as the first apertures of the first stencil 340, the set of pads constituting the second pads would be the same as the set of pads constituting the first pads.

The second stencil 360 may be formed by machining or laser etching a sheet of metal, such as stainless steel, for example. The second stencil 360 alternatively may be formed by photolithography or any other means for applying the predetermined pattern of second pads 321 to 331, for example. In various embodiments, the second stencil 360 may be reusable, thus providing cost savings. As mentioned above, in the configuration depicted in FIG. 3C, the second stencil 360 includes apertures over pads 328, 329, 330 and 331 (unlike the first stencil 340), which are designed to receive a flip chip component having previously formed solder bumps on its surface.

Flux (e.g., from flux source 392) is applied through the second apertures 361 to 371 in the second stencil 360 to provide corresponding flux deposits 461 to 471, respectively. The flux deposits 461 to 471 have a sticky consistency. Like the second apertures 361 to 371 in the second stencil 360, the flux deposits 461 to 471 correspond to the predetermined pattern of pads 321 to 331 of the representative PCB 300. Notably, the flux deposits 461 to 467 are deposited onto the solder bumps 541 to 547, respectively, since second apertures 361 to 367 in the second stencil 360 are effectively the same (e.g., in size, shape and location) as the first apertures 341 to 347 in the first stencil 340. In contrast, the flux deposits 468 to 471 are deposited onto the pads 328 to 331, respectively (which have no solder bumps), since the second apertures 368 to 371 are formed in a location of the second stencil 360 where there were no first apertures in the first stencil 340.

In an embodiment, the flux may be applied by spreading the flux from the flux source 392, initially provided at one end of the second stencil 360, over the top surface of the second stencil 360 using the squeegee 390, which may be manipulated manually or may be automated. Downward pressure applied to the squeegee 390 while spreading the flux forces the flux into the second apertures 361 to 371 to form the flux deposits 461 to 471, respectively. The second stencil 360 is then removed, leaving the flux deposits 461 to 467 on the solder bumps 541 to 547, respectively, and leaving the flux deposits 468 to 471 on the pads 328 to 331, respectively.

Referring to FIG. 3D, various illustrative components 651 to 654 are placed on the flux deposits 461 to 471. More particularly, SMT component 651 is placed on the flux deposits 461 and 462, SMT component 652 is placed on the flux deposits 463 and 466, flip chip component 653 (with previously formed flip chip solder bumps 668, 669, 670 and 671) is placed on the flux deposits 468, 469, 470 and 471, and flip chip component 654 (with no previously formed solder bumps) is placed on the flux deposits 465, 466 and 467. Of course, various embodiments of the method, split into multiple processes, for attaching components to pads on a PCB may involve placement of other types and/or numbers of components, without departing from the scope of the present teachings. As discussed above, placement of the components 651 to 654 onto the flux deposits 461 to 471 may involve a pick and place procedure.

Referring to FIG. 3E, the flux deposits 461 to 467 and the solder bumps 541 to 547 are reflowed to form corresponding solder joints 761 to 767, respectively. At the same time, the flux deposits 468 to 471 and the flip chip solder bumps 668 to 671 are reflowed to form corresponding solder joints 768 to 771, respectively. As discussed above, reflowing the flux deposits 461 to 467 and the solder bumps 541 to 547, and the flux deposits 468 to 471 and the flip chip solder bumps 668 to 671, is performed by applying heat, causing the flux deposits 461 to 467 and the solder bumps 541 to 547, and the flux deposits 468 to 471 and the flip chip solder bumps 668 to 671, to substantially melt and mix together, respectively. The heat is then removed to enable cooling, and formation of the solder joints 761 to 771. More particularly, the solder joints 761 and 762 attach the SMT component 651 to the pads 321 and 322; the solder joints 763 and 764 attach the SMT component 652 to the pads 323 and 324; the solder joints 768, 769, 770 and 771 attach the flip chip component 653 to the pads 328, 329, 330 and 331; and the solder joints 765, 766 and 767 attach the flip chip component 654 to the pads 325, 326 and 327.

The tacky textures the flux deposits 461 to 471 generally hold the SMT components 651, 652 and the flip chip components 653, 654 substantially in place during the reflow process, so that the SMT components 651, 652 and the flip chip components 653, 654 effectively do not change position and/or orientation, as a practical matter. The formation of the solder joints 761 to 771 ends the second process of the method of attaching components to pads on the PCB 300.

In various embodiments, a molded compound (not shown) may be formed over the top surface of the substrate 310, the SMT components 651, 652, and the flip chip components 653, 654. The molded compound may be formed of a reinforced or non-reinforced epoxy resin, for example, and may be applied using any process compatible with fabrication of semiconductor devices, such as injection molding, transfer molding, or compression molding, for example. The molded compound generally protects and may hermetically seal the SMT components 651, 652, and the flip chip components 653, 654, and provides additional structural support.

Thus, according to embodiments of the present disclosure, a method is provided for attaching components to pads on a PCB, comprising two serial processes. Accumulated tolerance is therefore split between the two processes, with a much lower tolerance in each process than the accumulated tolerance of a conventional method for attaching components to pads on a PCB portion. Generally, according to various embodiments, solder paste is printed on pads of the PCB substrate, then the solder paste is reflowed to create corresponding solder bumps (skipping component placement before reflowing the solder paste) during the first process. Because components are not in place when the solder paste is reflowed, solder paste squeeze-out and solder paste electrical shorts are eliminated. The first process thus does not require high printing accuracy, and does not need PCB grouping, due in part to the greater margin of error enabled by reflowing the solder paste without the components already in place on the solder paste.

During the second process, flux is printed on the solder bumps provided by the first process, components are placed on the flux, and then the flux and solder bumps are reflowed to corresponding form solder joints between the components and the pads on the PCB. The second process thus does not require low force placement of components (on solder paste prior to reflow), does not require high printing accuracy, and does not need PCB grouping.

The various methods, components, structures and parameters are included by way of illustration and example only and not in any limiting sense. In view of this disclosure, those skilled in the art can implement the present teachings in determining their own applications and needed methods, components, materials, structures and equipment to implement these applications, while remaining within the scope of the appended claims.

What is claimed is:

1. A method of attaching components to plurality of pads on a printed circuit board (PCB), the pads being arranged in a predetermined pattern, the method comprising:
    placing a first stencil over the PCB, the first stencil defining a plurality of first apertures corresponding to first pads of the plurality of pads on the PCB;
    applying solder paste through the first apertures in the first stencil to provide corresponding solder paste deposits on the first pads;
    reflowing the solder paste deposits to form corresponding solder bumps on the first pads, respectively;
    placing a second stencil over the PCB, the second stencil defining a plurality of second apertures, the plurality of second apertures comprising a first group of second apertures corresponding to the first pads;
    applying flux through the second apertures in the second stencil to provide flux deposits on the solder bumps;
    placing at least one component on the flux deposits; and
    reflowing the flux deposits and the solder bumps to form corresponding solder joints between the at least one component and the first pads, respectively.

2. The method of claim 1, further comprising:
    performing a coining process on the solder bumps formed on the first pads to provide flattened surfaces of the solder bumps, wherein the flattened surfaces of the solder bumps are substantially co-planar.

3. The method of claim 1, further comprising:
performing a solder paste inspection of the solder paste deposits on the first pads before reflowing the solder paste.

4. The method of claim 1, wherein the at least one component comprises a surface mount technology (SMT) component.

5. The method of claim 1, wherein the at least one component comprises a flip chip component.

6. The method of claim 1, further comprising:
cleaning flux residue from the PCB.

7. The method of claim 1, wherein the plurality of second apertures further comprise a second group of second apertures defined in the second stencil corresponding to second pads of the plurality of pads on the PCB, the second pads having no corresponding first apertures defined in the first stencil,
wherein applying the flux through the second apertures in the second stencil further provides flux deposits on the second pads, and
wherein placing the at least one component on the flux deposits includes placing another component on the flux deposits on the second pads.

8. The method of claim 7, wherein the other component comprises a flip chip component.

9. The method of claim 8, wherein the flip chip component includes previously formed solder bumps configured to align with the second pads when placed on the flux deposits on the second pads, and
wherein reflowing the flux deposits and the solder bumps includes reflowing the solder bumps on the flip chip component, forming corresponding solder joints between the other component and the second pads.

10. The method of claim 1, wherein applying the solder paste comprises spreading the solder paste over a top surface of the first stencil using a squeegee, and wherein applying the flux comprises spreading the flux over a top surface of the second stencil using a squeegee.

11. The method of claim 1, wherein the solder paste comprises a mixture of solder and flux in predetermined proportions.

12. A method of attaching components to a plurality of pads on a printed circuit board (PCB), wherein total accumulated tolerances of the method are reduced by separating accumulated tolerances into multiple processes, the method comprising:
performing a first process having a first accumulated tolerance, the first process comprising:
placing a first stencil over the PCB, the first stencil defining a plurality of first apertures corresponding to the pads on the PCB;
printing solder paste onto the pads using the first stencil;
reflowing the printed solder paste to form corresponding solder bumps on the pads, respectively;
performing a second process having a second accumulated tolerance, the second process comprising:
placing a second stencil over the PCB, the second stencil defining a plurality of second apertures corresponding to the pads on the PCB;
printing flux onto the solder bumps using the second stencil;
placing at least one component on the printed flux; and
reflowing the printed flux and the solder bumps to form corresponding solder joints between the at least one component and the first pads, respectively.

13. The method of claim 12, wherein performing the first process further comprises:
performing a coining process on the solder bumps formed on the pads to provide flattened surfaces of the solder bumps.

14. The method of claim 12, wherein performing the first process further comprises:
performing a solder paste inspection of the printed solder paste on the pads before reflowing the printed solder paste.

15. The method of claim 12, wherein performing each of the first process and the second process further comprises:
cleaning residual flux from the PCB.

16. A method of attaching a component to at least one pad on a printed circuit board (PCB), the method comprising:
applying solder paste onto the at least one pad using a first stencil to provide at least one solder paste deposit on the at least one pad, respectively;
reflowing the at least one solder paste deposit to form a corresponding at least one solder bump on the at least one pad, respectively, before attaching the component to the at least one pad, providing a first accumulated tolerance;
applying flux onto the at least one solder bump using a second stencil to provide at least one flux deposit on the at least one solder bump, respectively;
placing the component on the at least one flux deposit; and
reflowing the at least one flux deposit and the at least one solder bump to form a corresponding a least one solder joint between the component and the at least one pad, respectively, providing a second accumulated tolerance,
wherein a combined first and second accumulated tolerances reduce total accumulated tolerance as compared to reflowing the at least one solder paste deposit after placing the component on the at least one solder paste deposit.

17. The method of claim 16, wherein the component is placed on the at least one flux deposit without using low force component placement.

18. The method of claim 16, wherein reflowing the at least one solder paste deposit to form the corresponding at least one solder bump on the at least one pad, respectively, before attaching the component to the at least one pad prevents solder paste squeeze-out and solder paste electrical shorts.

19. The method of claim 16, wherein the first and second accumulated tolerances are determined using one of a root sum square and root mean square method.

20. The method of claim 16, wherein the first and second accumulated tolerances are calculated as arithmetic sum tolerances, which provide worst-case maximum or minimum values.

* * * * *